United States Patent [19]

Hua et al.

[11] Patent Number: 4,842,699

[45] Date of Patent: Jun. 27, 1989

[54] METHOD OF SELECTIVE VIA-HOLE AND HEAT SINK PLATING USING A METAL MASK

[75] Inventors: Chang-Hwang Hua, Palo Alto; Ding-Yuan S. Day, Sunnyvale; Simon S. Chan, Belmont, all of Calif.

[73] Assignee: Avantek, Inc., Santa Clara, Calif.

[21] Appl. No.: 192,199

[22] Filed: May 10, 1988

[51] Int. Cl.⁴ .............................................. C25D 5/02
[52] U.S. Cl. ....................................................... 204/15
[58] Field of Search ......................... 204/15, 38.1, 38.4

[56] References Cited

U.S. PATENT DOCUMENTS

| | | | |
|---|---|---|---|
| 3,323,198 | 6/1967 | Shortes | 29/460 |
| 3,484,341 | 12/1969 | Devitt | 204/15 |
| 3,562,009 | 2/1971 | Cranston et al. | 427/43.1 |
| 4,089,992 | 5/1978 | Doo et al. | 427/94 |
| 4,153,988 | 5/1979 | Doo | 29/626 |
| 4,211,603 | 7/1980 | Reed | 156/659.1 |
| 4,348,253 | 9/1982 | Subbarao et al. | 156/643 |
| 4,403,241 | 9/1983 | Butherus et al. | 357/55 |
| 4,426,767 | 1/1984 | Swanson et al. | 29/571 |
| 4,467,521 | 8/1984 | Spooner et al. | 29/576 E |
| 4,512,829 | 4/1985 | Ohta et al. | 156/659.1 |

Primary Examiner—T. M. Tufariello
Attorney, Agent, or Firm—Limbach, Limbach & Sutton

[57] ABSTRACT

A method for simultaneous selective plating of viaholes and heat sinks associated with a semiconductor wafer using a metal mask and comprising the steps of:
  (a) coating a first side of the wafer with an insulating layer to prevent electroplating on this first side;
  (b) patterning on a second side of the wafer, opposite to the first side, a metal mask for defining the areas where plating should not occur;
  (c) forming via-holes through said wafer;
  (d) depositing a thin conductive film to coat the bottom and walls of the via-holes as well as areas of the second side of the wafer not covered by the metal mask; and
  (e) electrolytically plating the resulting wafer while ultrasonically agitating the electrolyte if necessary to ensure sufficient electrolyte transport into the via-holes for uniform plating.

12 Claims, 1 Drawing Sheet

METHOD OF SELECTIVE VIA-HOLE AND HEAT SINK PLATING USING A METAL MASK

FIELD OF THE INVENTION

This invention relates to the field of semiconductor processing. More particularly, this invention discloses a method of selective via-hole and heat sink plating using a metal mask.

BACKGROUND OF THE INVENTION

It is often desirable to connect circuit patterns on one side of a semiconductor wafer with circuit patterns on the opposite side of the wafer. Various techniques are known for providing conductive via-holes through the wafer to provide this connection, such as by laser or electron beam drilling followed, in some methods, by a plating operation to cause the interior surface of the via-hole to be conductive.

It is also sometimes necessary to provide a heat sink on one surface of the semiconductor wafer. This can also be done by a plating operation. While it is desirable to combine as many steps of the two operations as possible, a number of obstacles exist. For example, ultrasonic agitation of the electrolyte is necessary during electrolytic plating of deep via-holes with steep side walls and small diameters in order for the plating to be uniform inside the via-hole. However, where a photoresist mask has previously been applied, as for example to define the heat sinks, the photoresist mask is likely to peel off in a short time under ultrasonic agitation.

Where a photoelectrochemical plating technique is used to fill up the via-holes as described in U.S. Pat. No. 4,399,004, followed by selective electrolytic heat sink plating using a photoresist mask, there is the problem that photoelectrochemical plating is very sensitive to the surface finish of the via-holes and the wafer and can be difficult to control under production conditions.

Thus, there is a need for a process for simply and simultaneously forming plated via-holes and heat sinks.

SUMMARY AND OBJECTS OF THE INVENTION

It is therefore an object of the present invention to provide a method for selectively, simultaneously electroplating via-holes and heat sinks on a wafer without requiring the simultaneous presence of a photoresist.

The above and other objects are obtained by the present invention of a method for selective plating of via-holes and heat sinks on a semiconductor wafer using a metal mask and comprising the steps of:

(a) coating a first side of the wafer with an insulating layer to prevent electroplating on this first side;

(b) patterning on a second side of the wafer, opposite to the first side, a metal mask for defining the areas where plating should not occur;

(c) forming via-holes from the second side of the wafer;

(d) selectively depositing a thin conductive film to coat the bottom and walls of the via-holes as well as areas of the second side of the wafer not covered by the metal mask; and (e) performing electrolytic plating on the resulting wafer, whereby the heat sinks and the interior of the via-holes are simultaneously plated under ultrasonic agitation to ensure sufficient electrolyte transport into the via-holes for uniform plating.

In a preferred embodiment of the invention the thin conductive film in step (d) is selectively deposited by electroless plating. The step of patterning the metal mask comprises the steps of forming a first layer of a noble metal on the second side of the wafer, to serve as a lateral connection during electroplating, and forming, on top of the first layer, a second layer of a protective metal which readily forms an inert, impervious oxide in air. In the preferred embodiment the first layer is gold and the second layer is titanium. In some embodiments an adhesive metallic layer is formed on the second side of the wafer prior to forming the first layer of the mask, which first layer is then formed on top of the adhesive layer. The adhesive layer may be required in some situations to improve the adhesion of the metal mask structure to the second side of the wafer.

This method has the advantage that the via-holes and heat sinks may be simultaneously and electrolytically plated, while using ultrasonic agitation, and without requiring the presence of a photoresist mask during the electroplating operation.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE PREFERRED EMBODIMENT

Figure 1:
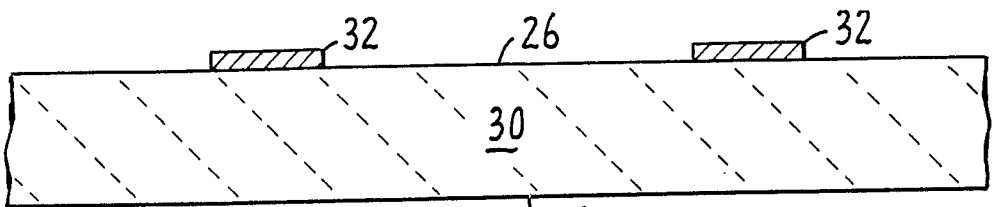
FIGS. 1-6 are sectional views of a semiconductor wafer illustrating the process sequence of the present invention.

FIG. 1 shows the cross section of a semiconductor wafer 30 with a first surface 26 and an opposite, second surface 28. The wafer may be formed of silicon or gallium arsenide. Metal pads 32, for example source pads of field effect transistors, are formed on the surface 26 by conventional processing techniques.

Figure 2:
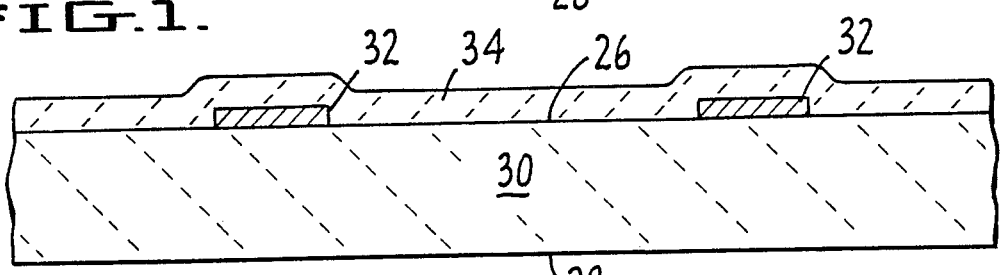

In FIG. 2, an insulating layer 34 is applied to cover surface 26 of wafer 30 and conductive pads 32. Layer 34 may be formed of a wax having a high softening temperature or any other insulating material which will withstand conditions in the electrolytic bath.

Figure 3:
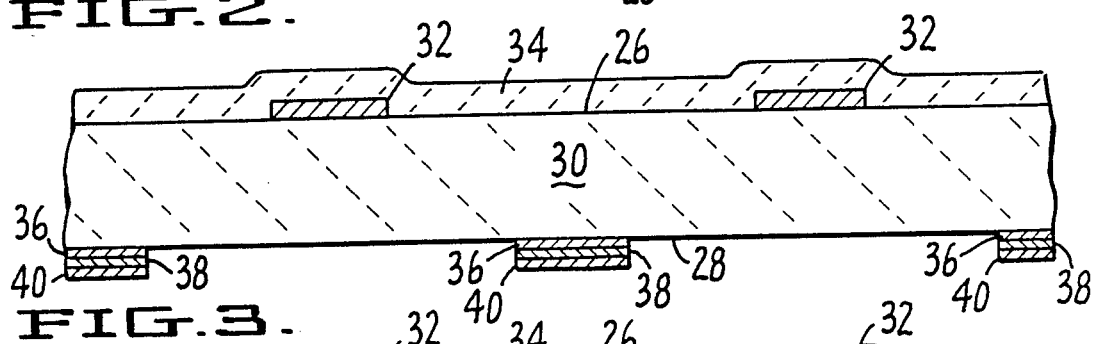

The next step is to apply the metal mask to the surface 28 to define the heat sink areas as shown in FIG. 3. In the preferred embodiment the metal mask is a three-layer composite. The layer 36 adjacent to the surface 28 is an adhesion layer, and may be omitted if the subsequent layers have a good adhesion to the wafer. The next layer 38 is termed the conductive layer for reasons which will be apparent later. The conductive layer 38 should be a metal that does not form a native oxide in air, e.g., gold. The last layer 40, which is the outermost layer, is termed the protective layer. It should be a metal such as titanium which readily forms an impervious surface oxide in air and subsequently resists electroplating. The three-layer composite metal mask is best formed by successive evaporation in conjunction with photoresist lift-off.

Figure 4:
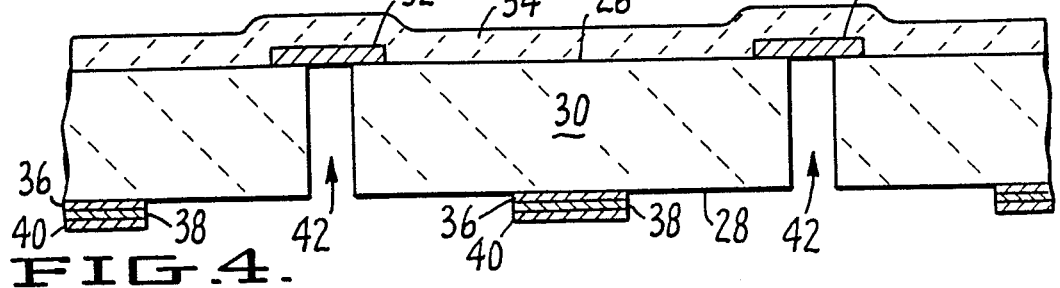

Via-holes 42, as shown in FIG. 4, can be preferably reactive ion etched from surface 28 completely through the wafer so that the via-holes 42 extend from the surface 28 to the surface 26, exposing a part of the bottom surfaces of metal pads 32. In less desirable embodiments the via-holes can be wet-chemical etched, but this will lead to graded side walls. As a result, the via-hole spacing must be large enough to allow for the side wall grading.

Figure 5:
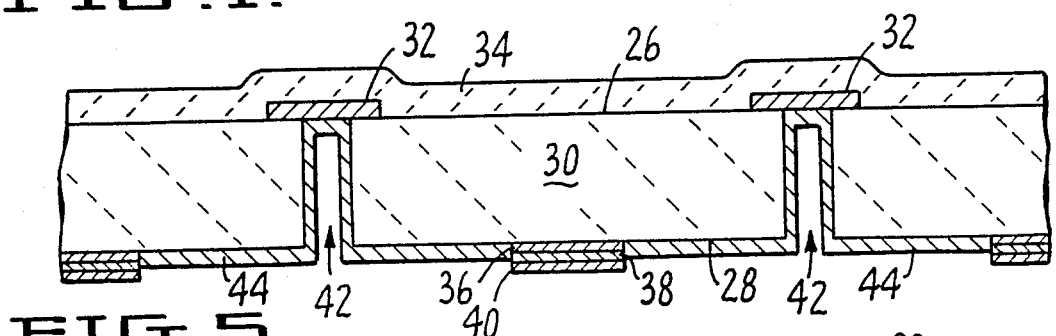
Figure 6:
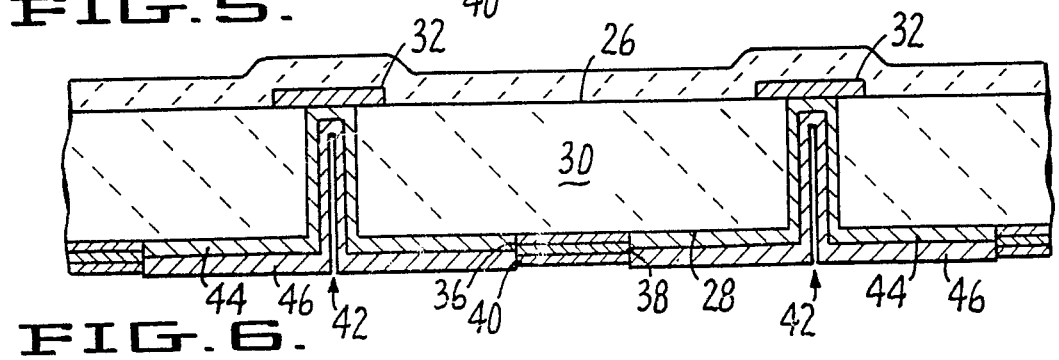

As shown in FIG. 5, a thin conductive layer 44 is deposited by electroless plating on the wafer surface 28, on the walls of the holes 42, and on the surfaces of the metal pads 32 exposed by the holes 42. The electroless plating solution must be selected such that the deposition of layer 44 occurs everywhere except over the oxide of the protective metal layer 40. By making the layer 44 thicker than the adhesive layer 36, all portions of the layer 44 will be electrically coupled through the conductive layer 38 of the composite metal mask. The conductive layer 44 is then used as a cathode for electroplating to form the layer 46 in FIG. 6. The protective layer 40 acts as a mask to locally prevent electroplating. The layer 46 may be formed as thick as necessary to provide efficient electrical and thermal conduction from first surface 26 to second surface 28 of the wafer 30. The portion of the layer 46 which extends along the surface 28 of the wafer 30 acts as a heat sink. Thus, heat is efficiently removed from the first side 26 of the wafer 30 where electronic devices or integrated circuits are located.

For via-holes with a large depth-to-diameter ratio, ultrasonic agitation of the electroplating solution may be necessary to ensure uniform plating of the bottom and inside walls of the via holes. Such is the case with reactive-ion-etched via-holes, where a depth-to-diameter ratio of up to 3 can be routinely achieved. The aforementioned mask is well suited for such plating conditions whereas a photoresist mask will peel off. If the total thickness of the metal mask is made sufficiently thin, the wafer may be separated into dice by scribing on the areas corresponding to the metal mask.

An improved method for simultaneously forming plated via-holes and heat sinks is disclosed. Although the present invention has been shown and described with respect to preferred embodiments, various changes and modifications which are obvious to a person skilled in the art to which the invention pertains are deemed to lie within the spirit and scope of the invention.

What is claimed is:

1. A method for selective plating of via-holes and heat sinks associated with a semiconductor wafer having a first side and a second side by the use of a metal mask comprising the steps of:
   (a) coating the first side of the wafer with an insulating layer to prevent electroplating on the first side;
   (b) patterning a metal mask on the second side of the wafer for defining the areas where plating should not occur;
   (c) etching via-holes through the wafer from the second side of the wafer;
   (d) depositing a thin conductive film to coat the bottom and walls of the via-holes as well as areas of the second side of the wafer not covered by the metal mask; and
   (e) electrolytically plating the resulting wafer so that the walls of the via-holes are plated and heat sinks are simultaneously plated on the second side of the wafer.

2. The method according to claim 1 wherein the electrolytic plating step further comprises electroplating the resulting wafer while ultrasonically agitating the electrolyte to ensure sufficient electrolyte transport into the via-holes for uniform plating.

3. The method according to claim 1 wherein the step of depositing the thin conductive film comprises electroless plating the thin conductive film on the bottom and walls of the via-holes as well as areas of the second side of the wafer not covered by the metal mask.

4. The method according to claim 1 wherein the step of patterning the metal mask consists of selectively applying a first layer of a noble metal on desired areas of the second side of the wafer and selectively covering this first layer with a second layer of a protective metal which readily forms an inert and impervious oxide in air.

5. The method according to claim 4 wherein the step of applying the first layer of the metal mask comprises applying a conductive metal which does not oxidize in air and the step of applying the second layer of the metal mask comprises applying titanium.

6. The method according to claims 4 or 5 wherein the first layer of the metal mask is formed of gold.

7. The method according to claim 4 wherein the step of patterning the metal mask comprises the steps of selectively depositing a first layer of the metal mask on desired areas of the second side of the wafer, said first layer being composed of a metal with good adhesion to the wafer, followed by selectively depositing a second layer of the metal mask of a noble metal which does not oxidize in air, overlaying the first layer, and followed by selectively depositing a third layer of the metal mask of protective metal which overlays the second layer, the third layer forming an inert and impervious oxide in air.

8. The method according to claim 7 wherein the wafer has one or more metal pads on its first side and the step of etching the via-holes comprises etching the holes through the wafer to a depth such that they terminate at the pads.

9. The method according to claim 1 further comprising the initial step of forming at least one conductive pad on said first side, said pad having a top surface and a bottom surface, said bottom surface facing the first side of the wafer, and then forming the insulating layer over said first side of said wafer and said pad.

10. The method according to claim 9 wherein the step of etching the via-holes comprises etching the holes through the wafer to a depth such that they terminate at the pads.

11. The method according to claims 1 or 9 wherein the step of forming the insulating layer comprises forming a layer of wax.

12. A method of fabricating a semiconductor wafer with electroplated via-holes and heat sinks as recited in claim 1 wherein the via-holes have a depth to diameter ratio of up to 3.

* * * * *